United States Patent [19]

Kono et al.

[11] Patent Number: 5,455,536
[45] Date of Patent: Oct. 3, 1995

[54] DEMODULATOR CIRCUIT AND DEMODULATING METHOD EMPLOYING BIT ERROR RATE MONITOR

[75] Inventors: Shinichi Kono; Tamio Okui, both of Tokyo, Japan

[73] Assignee: NEC Corporation, Japan

[21] Appl. No.: 180,120

[22] Filed: Jan. 12, 1994

[30] Foreign Application Priority Data

Jan. 13, 1993 [JP] Japan .................... 5-004312

[51] Int. Cl.$^6$ .................... H04L 27/06; H04L 27/22
[52] U.S. Cl. .................... 329/325; 329/302; 329/307; 329/319; 329/360; 371/5.1; 371/5.4; 371/47.1; 375/344
[58] Field of Search .................... 329/302, 303, 329/307, 308, 309, 318, 319, 325, 360; 375/10, 81, 97, 99, 103, 224, 226, 344, 346; 371/5.1, 5.3, 5.5, 30, 5.2, 5.4, 47.1, 64; 455/260

[56] References Cited

U.S. PATENT DOCUMENTS

| | | | |
|---|---|---|---|
| 4,332,029 | 5/1982 | Campbell et al. | 371/22 |
| 4,387,461 | 6/1983 | Evans | 371/5 |
| 4,563,651 | 1/1986 | Ohta et al. | 329/318 |
| 4,580,101 | 4/1986 | Lax | 329/325 |
| 4,594,556 | 6/1986 | Ohta | 329/319 OR |
| 4,680,765 | 7/1987 | Donald | 371/42 |
| 4,940,951 | 7/1990 | Sakamoto | 331/4 |
| 5,065,107 | 11/1991 | Kumar et al. | 329/308 |
| 5,301,197 | 4/1994 | Yamada et al. | 371/5.1 |

FOREIGN PATENT DOCUMENTS 61-136308  6/1986  Japan .
62-159505  7/1987  Japan .

Primary Examiner—Robert J. Pascal
Assistant Examiner—Arnold Kinkead
Attorney, Agent, or Firm—Ostrolenk, Faber, Gerb & Soffen

[57] ABSTRACT

A demodulator circuit and a demodulating method are disclosed. A demodulator including a phase-locked loop for a receive carrier recovery or a phase lock recovery demodulates an input received signal and a band of a loop filter of the phase-locked loop is controlled by a control signal. A bit error rate monitor detects a bit error rate of a demodulated outputs the control signal on the basis of the bit error rate result of the demodulator, and a loop filter band controller output from the bit error rate monitor. Hence, the bit error rate of the demodulated signal is detected and the loop filter band of the phase-locked loop of the demodulator is controlled based on the detected bit error rate. As a result, an exact control of the loop filter band of the demodulator can be performed on the basis of the received signal state without using any received signal power detector, any C/N detector or the like.

2 Claims, 3 Drawing Sheets

DEMODULATOR CIRCUIT AND DEMODULATING METHOD EMPLOYING BIT ERROR RATE MONITOR

BACKGROUND OF THE INVENTION

The present invention relates to a radio receive coherent detection demodulator circuit and its demodulating method for use in radio communication, and in particular to a receive carrier loop filter of a phase-locked loop (PLL) for a carrier recovery on the basis of a bit error rate (BER) of a demodulated signal in demodulator and its demodulating method.

Description of the Related Arts

Conventionally, a phase lock demodulator is provided with a carrier PLL (phase-locked loop) for reproducing a receive carrier and the phase lock demodulator demodulates received signals and extracts a recovered clock. When a receiving state becomes worse, a band of a receive carrier loop filter within this carrier PLL is controlled so as to narrow the band, thereby improving a carrier slip resistance due to noise.

In such a demodulator circuit, as a technical conception for controlling a band value of a loop filter of its demodulator, for example, some techniques are proposed. That is, as disclosed in Japanese Patent Laid-Open No. Sho62-159505, a receive signal power as a control reference value of a loop filter band is used in an FM demodulator circuit. And, as disclosed in Japanese Patent Laid-Open No. Sho 61-136308, a C/N is obtained and by the obtained C/N, a loop filter band is controlled.

FIG. 1 is a conceptional view for showing a loop filter band control by a C/N in a conventional demodulator circuit. In FIG. 1, a signal filter 40 passes a received signal S to output a received signal $S_{11}$ and this received signal $S_{11}$ is input to a demodulator 44 and a C/N discriminator 46. A noise filter 42 passes noises to be measured to output a noise signal $S_{12}$ and this noise signal $S_{12}$ is input to tile C/N discriminator 46. The C/N discriminator 46 compares the received signal $S_{11}$ with the noise signal $S_{12}$ to carry out a C/N measurement, a loop filter band is controlled.

As described above, in the conventional demodulators, the receive signal power and the result of the C/N measurement are used as a reference of the loop filter band control. Hence, in the case of the receive signal power as the reference, a reference value is changed from system to system against a variation of a standard input level at different circuit designs for every system. Also, in the case of the C/N measurement, as shown in FIG. 1, it is necessary to measure a power of a different frequency band from a receive signal band in order to measure the noise and another filter different from the filter of the received signals is required. Also, when another carrier is in existence in the band whose noise is measured, a larger power level than an actual noise amount for its carrier quantity is detected and thus it is apprehended that an error is caused in the C/N measurement.

SUMMARY OF THE INVENTION

It is therefore an object of the present invention to provide a demodulator circuit in view of the aforementioned problems of the prior art, which is capable of performing an exact control of a loop filter band without using a receive signal power detector or a C/N detector.

It is another object of the present invention to provide a demodulating method circuit which is capable of carrying out an exact control of a loop filter band without using a receive signal power detector or a C/N detector.

In accordance with one aspect of the present invention, there is provided a demodulator circuit, comprising a demodulator including a phase-locked loop for a receive carrier recovery, or a phase lock recovery of an input received signal to carry out a demodulation to output a demodulated result and in which a band of a loop filter of the phase-locked loop is controlled by a control signal; a bit error rate monitor for detecting a bit error rate of the demodulated result of the demodulator; and a loop filter band controller for outputting the control signal for controlling the band of the phase-locked loop on the basis of the bit error rate detected by the bit error rate monitor.

In accordance with another aspect of the present invention, there is provided a demodulating method, comprising a demodulation step for demodulating an input received signal by a phase lock recovery or a receive carrier recovery by using a demodulator including a phase-locked loop to output a demodulated result, the phase-locked loop including a loop filter; a bit error rate monitor step for detecting a bit error rate of the demodulated result of the demodulator; a control signal output step for outputting a control signal for controlling a band of the loop filter of the phase-locked loop on the basis of the bit error rate; and a band control step for controlling the band of the loop filter of the phase-locked loop in the demodulator by the control signal.

In the demodulator circuit, preferably, the demodulator outputs received data and a recovered clock as the demodulated result, and the bit error rate monitor includes an error corrector for carrying out an error correction of the received data to output corrected data; a delay for delaying the received data for a time period corresponding to an error correction operation in the error corrector to output delayed data: a comparator for carrying out a comparison between the corrected data and the delayed data to output an error indication pulse when the corrected data and the delayed data are not coincident: an error counter for counting the error indication pulses output from the comparator, in which a counter value is cleared by an external signal; a bit counter for counting a received data bit number by the recovered clock output from the demodulator and, when a counter value of the bit counter reaches a predetermined value, outputting a latching pulse and clearing a count number of the bit counter to repeat the counting again; and a latch circuit for latching the counter value of the error counter by the latching pulse output from the bit counter, in which the loop filter band controller outputs the control signal on the basis of the counter value latched by the latch circuit.

In the demodulating method, preferably, the demodulator outputs received data and a recovered clock as the demodulated result in the demodulating step, and the bit error rate monitor step includes an error correction step for carrying out an error correction of the received data to output corrected data: a delay step for delaying the received data for a time period corresponding to an error correction operation in the error corrector to output delayed data; a comparison step for carrying out a comparison between the corrected data and the delayed data to output an error indication pulse when the corrected data and the delayed data are not coincident; an error count step for counting the error indication pulses obtained in the comparison step to output a count value which is cleared by an external signal; a bit count step for counting a received data bit number by the recovered clock output from the demodulator and, when a count value obtained in the bit counter step reaches a predetermined value, outputting a latching pulse and clearing a count number obtained in the bit counter step to repeat the counting again; and a latch step for latching the count value obtained in the error count step by the latching pulse obtained in the bit counter step.

According to the present invention, the BER (bit error rate) monitor monitors the BER of the demodulated signals obtained in the demodulator and the band of the loop filter of the carrier recovery phase-locked loop in the demodulator is controlled based on the BER.

In the BER monitor, the error-corrected received data and the received data before the error correction are compared with each other in the comparator and the uncoincidence of this comparison is counted by the error counter. Since this count number indicates a bit error approximate number before the error correction, the bit error approximate number is counted for a fixed time period to obtain an approximate bit error rate before the error correction of the received signals. The loop filter band is controlled based on the approximate bit error rate. As a result, the exact control of the loop filter band can be carried out on the basis of the received signal state.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 1:
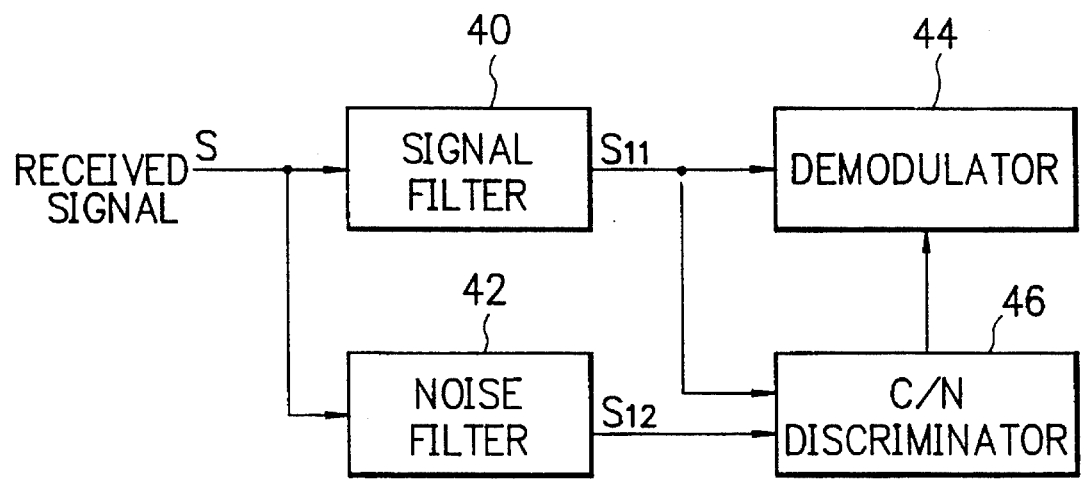
FIG. 1 is a block diagram showing a concept of a conventional demodulator circuit.
Figure 2:
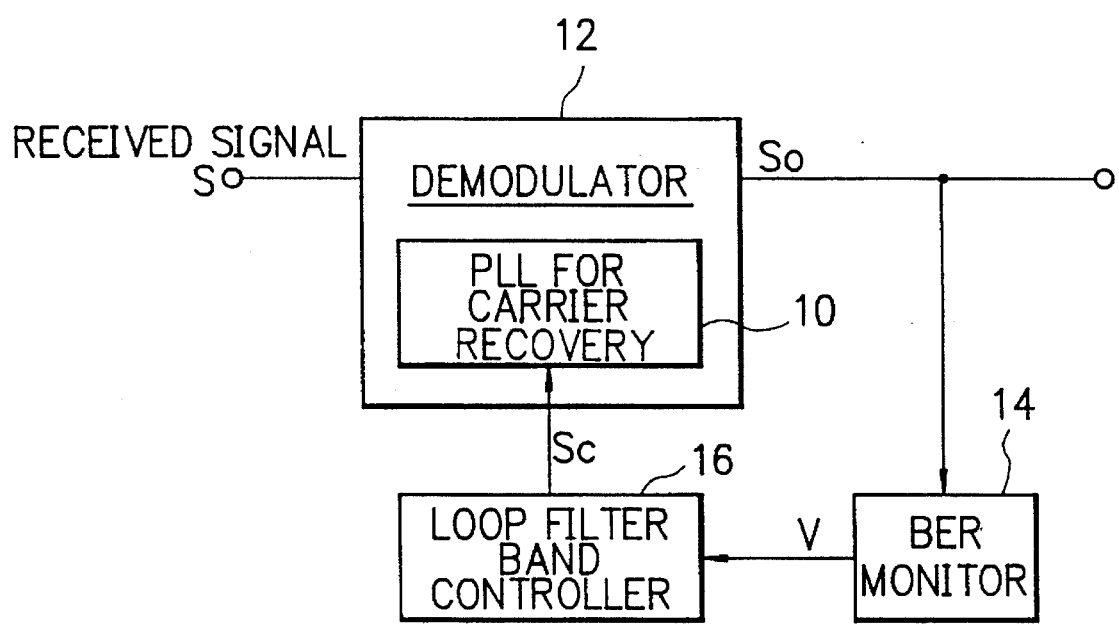
FIG. 2 is a block diagram showing a concept of a demodulator circuit according to the present invention.

Referring now to the drawings, wherein like reference characters designate like or corresponding parts throughout the views and thus the repeated description thereof can be omitted for brevity, there is shown in FIG. 2 a concept of a demodulator circuit according to the present invention.

As shown in FIG. 2, in the demodulator circuit, a demodulator 12 including a PLL (phase-locked loop) 10 for a carrier recovery outputs received data $S_0$ and the received data $S_0$ is input to a BER (bit error rate) monitor 14 for monitoring a BER of the received data $S_0$ to output a detected BER value V. A loop filter band controller 16 controls a band of a loop filter of the PLL 10 for the carrier recovery on the basis of the BER value V and outputs a control signal Sc for controlling the band of the loop filter of the demodulator 12 to the PLL 10.

Figure 3:
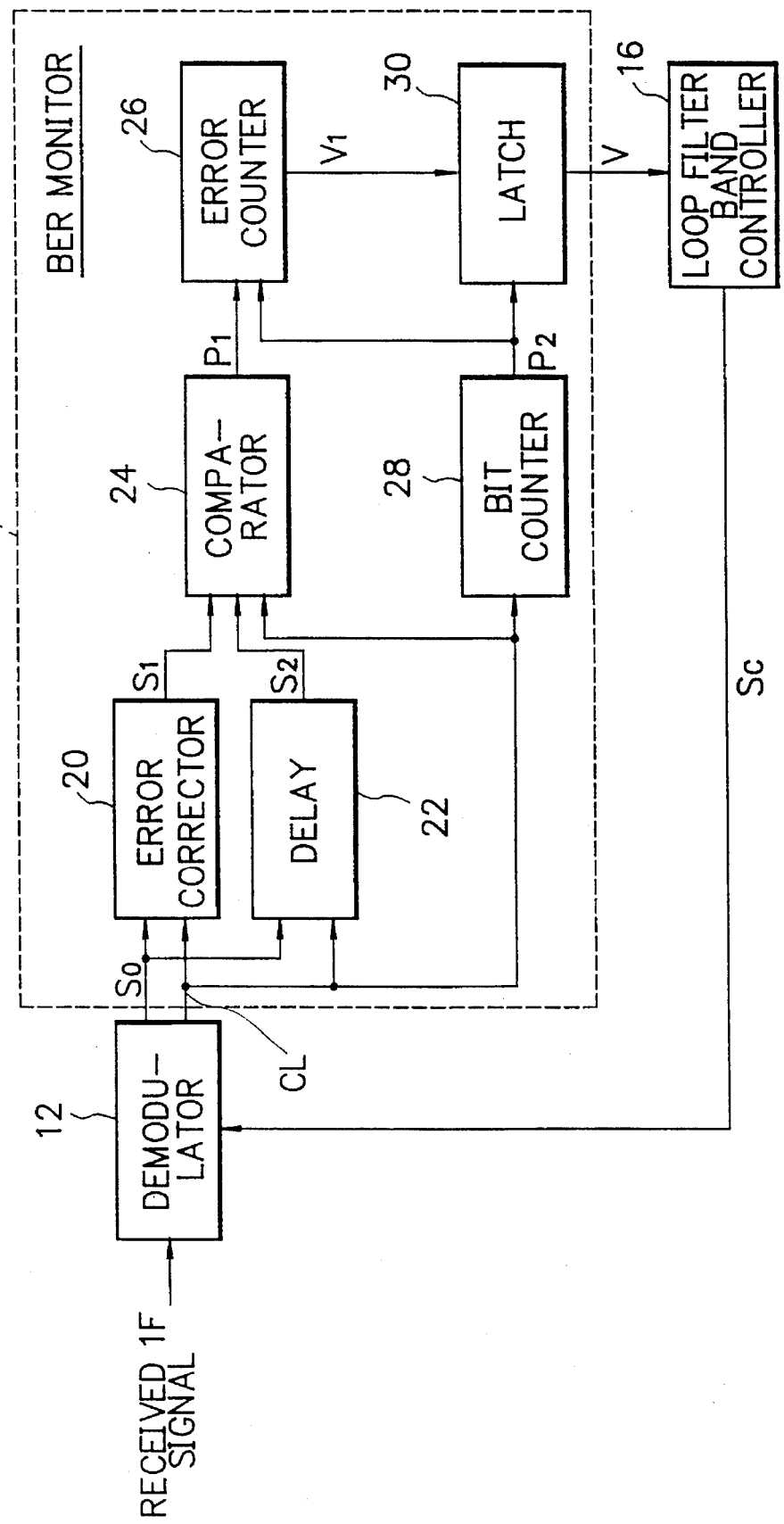
FIG. 3 is a block diagram of one embodiment of a demodulator circuit according to the present invention.

FIG. 3 illustrates a construction of the demodulator circuit shown in FIG. 2. In FIG. 8, in the demodulator 12, a received IF signal is demodulated by a coherent demodulation to output the received data $S_0$ and a recovered clock CL and a loop filter band is controlled by the control signal Sc output from the loop filter band controller 16.

In the BER monitor 14, an error corrector 20 inputs the received data $S_0$ and the recovered clock CL output from the demodulator 12 and executes an error correction of the same to output corrected data $S_1$. A delay 22 inputs the received data $S_0$ and the recovered clock CL and delays the received data $S_0$ for a delay amount by the error corrector 20 to output delayed data $S_2$. A comparator 24 inputs the recovered clock CL output from the demodulator 12, the received signal $S_1$ output from the error corrector 20 and the delayed received signal $S_2$ from the delay 22 and executes a comparison between tile received signal $S_1$ and the delayed data $S_2$ to output a pulse $P_1$ when these two signals are not coincident with each other. An error counter 26 counts the output pulses $P_1$ of the comparator 24 to output a counter value $V_1$ and its counter value is cleared by an external signal. A bit counter 28 counts the received data bit number by the recovered clock CL output from the demodulator 12. And, when the count value reaches a predetermined count number, the bit counter 28 outputs a pulse $P_2$ and the count number is cleared to repeat the counting again. A latch circuit 30 latches the count value $V_1$ output from the error counter 26 by the output pulse $P_2$ of the bit counter 28. The loop filter band controller 16 outputs the control signal Sc on the basis of the output value V of the latch circuit 30.

Next, the operation of the aforementioned demodulator circuit shown in FIG. 3 will now be described.

First, when the received IF signal is input to the demodulator 12, the demodulator 12 executes a coherent demodulation of the received IF signal and output the received data So and the recovered clock CL extracted from the received data $S_0$ to the error corrector 20 and the delay 22. The error corrector 20 which is an error corrector using a Viterbi decoding algorithm and carries out an error correction of the input received data $S_0$ and output the corrected data $S_1$ to the comparator 24. The delay 22 delays the input received data $S_0$ for a certain time corresponding to the correcting operation in the error corrector 20 to output the delayed data $S_2$ to the comparator 24. That is, for performing a comparison between the corrected data $S_1$ and the delayed data $S_2$ in the comparator 24, the bit timing of the received data $S_0$ should be matched. As a result of the comparison, the comparator 24 outputs the pulse $P_1$ to the error counter 26. The error counter 26 counts up the pulses $P_1$ output from the comparator 24. In the error counter 26, the count value is cleared by the external input and the output pulse $P_2$ of the bit counter 28 as the external input is used for clearing this count value.

The comparator 24 outputs the pulse of RZ (return-to-zero) when the value before the error correction is different from the value after the error correction and thus by counting this pulses, the error counter 26 can count an error approximate number. In this case, the reason for using not an error number but the error approximation number is that since the object to be compared with the received data before an FEC (forward error correction: an error correction on a receiving side) is not transmission data but the received data after the error correction, for a bit error contained in the data after the FEC, a different value from an essential error number is obtained. However, a scale of the BER before the error correction is different from that after the error correction and, of course, the error number before the error correction is larger than that after the same. Hence, by the bit comparison between before and after the error correction, nearly the same number of bit errors before the error correction can be obtained.

The bit counter 28 counts up the number of the recovered clocks CL output from the demodulator 12, that is, the bit number of the received data. And, when the count value of the bit counter 28 reaches the predetermined number, the bit counter 28 outputs the pulse $P_2$ and clears the count value by itself to start the counting again. This operation is repeated in the bit counter 28. The latch circuit 30 latches the count value $V_1$ output from the error counter 26 by using the pulse $P_2$ output from the bit counter 28. This value of the latch circuit 30 indicates the received data bit error sum approximate number before the error correction while the bit counter 28 executes the bit counting, and by dividing this error sum approximate number by the bit number counted by the bit counter 28, an approximate BER is calculated. The bit number of the bit counter 28 is predetermined and thus the loop filter band controller 16 can calculate the approximate BER so long as the loop filter band controller 16 can obtain the output value of the latch circuit 30. Based on this calculated approximate BER, the loop filter band controller 16 outputs the control signal Sc for controlling the loop filter band of the demodulator 12. As a result, the loop filter band of the demodulator 12 is controlled.

Next, some embodiments of the BER will be described. That is, it is assumed that the count bit number in the bit counter 28 is 100,000.

(A) When the output value V of the latch circuit 30 is "3", the BER is calculated as follows.

$$BER = 3/100,000 = 3E^{-5}$$

In this value, the error is a small number and an estimated Eb/No of the received data is high. As a result, a carrier slip rate is very small. Hence, even when the loop filter band is expanded, no carrier slip is caused and thus the loop filter band can be widened so as to strengthen against phase noise degradation or the like of an oscillator.

(B) when the output value v of the latch circuit 30 is "3,000", the BER is obtained as follows.

$$BER = ,000/100,000 = 3E^{-2}$$

In this value, the error is large and the estimated Eb/No of the received data is low. Hence, the loop filter band is narrowed so that the carrier phase-locked loop may not slip off.

As described above, according to the present invention, the BER is used as a reference value of the loop filter band control of the demodulator 12 and the approximate BER of the received signal itself (the bit comparison between before and after the FEC) is used as the BER. Hence, the loop filter band control of the demodulator 12 corresponding to the line state of the received signal can be carried out without using any received signal power detector, any C/N detector or the like required in the conventional system.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A demodulator circuit, comprising:
    a demodulator including a phase-locked loop for a receive carrier recovery, or a phase lock recovery of an input received signal to carry out a demodulation to output a demodulated result and in which a band of a loop filter of the phase-locked loop is controlled by a control signal, and wherein the demodulator outputs received data and a recovered clock as the demodulated result;
    a bit error rate monitor for detecting a bit error rate of the demodulated result of the demodulator, the bit error rate monitor includes;
        an error corrector for carrying out an error correction of the received data to output corrected data;
        a delay for delaying the received data for a time period corresponding to an error correction operation in the error corrector to output delayed data;
        a comparator for carrying out a comparison between the corrected data and the delayed data to output an error indication pulse when the corrected data and the delayed data are not coincident;
        an error counter for counting the error indication pulses output from the comparator, in which a counter value is cleared by an external signal;
        a bit counter for counting a received data bit number by the recovered clock output from the demodulator and, when a counter value of the bit counter reaches a predetermined value, outputting a latching pulse and clearing a count number of the bit counter to repeat the counting again;
        a latch circuit for latching the counter value of the error counter by the latching pulse output from the bit counter; and
    a loop filter band controller for outputting the control signal for controlling the band of the phase-locked loop on the basis of the bit error rate detected by the bit error rate monitor, and also the loop filter band controller outputs the control signal on the basis of the counter value latched by the latch circuit.

2. A demodulating method, comprising:
    a demodulation step for demodulating an input received signal by a phase lock recovery or a receive carrier recovery by using a demodulator including a phase-locked loop to output a demodulated result, the phase-locked loop includes a loop filter, and wherein the demodulator outputs received data and a recovered clock as the demodulated result in the demodulating step;
    a bit error rate monitor step for detecting a bit error rate of the demodulated result of the demodulator, the bit error rate monitor step includes the steps of;
        an error correction step for carrying out an error correction of the received data to output corrected data;
        a delay step for delaying the received data for a time period corresponding to an error correction operation in the error corrector to output delayed data;
        a comparison step for carrying out a comparison between the corrected data and the delayed data to output an error indication pulse when the corrected data and the delayed data are not coincident;
        an error count step for counting error indication pulses obtained in the comparison step to output a count value which is cleared by an external signal;
        a bit count step for counting a received data bit number by the recovered clock output from the demodulator and, when a count value obtained in the bit count step reaches a predetermined value, outputting a latching pulse and clearing a count number obtained in the bit count step to repeat the counting again;
        a latch step for latching the count value obtained in the error count step by the latching pulse obtained in the bit count step;
    a control signal output step for outputting a control signal for controlling a band of the loop filter of the phase-locked loop on the basis of the bit error rate; and
    a band control step for controlling the band of the loop filter of the phase-locked loop in the demodulator by the control signal.

* * * * *